United States Patent
Jeon

(10) Patent No.: US 7,426,130 B2
(45) Date of Patent: Sep. 16, 2008

(54) FERROELECTRIC RAM DEVICE AND DRIVING METHOD

(75) Inventor: Byung-Gil Jeon, Gyeonggi-do (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 196 days.

(21) Appl. No.: 11/015,428

(22) Filed: Dec. 16, 2004

(65) Prior Publication Data
US 2005/0135143 A1    Jun. 23, 2005

(30) Foreign Application Priority Data
Dec. 22, 2003    (KR)    ................ 10-2003-0094383

(51) Int. Cl.
*G11C 11/22*    (2006.01)
(52) U.S. Cl. .............. 365/145; 365/230.06; 365/189.09
(58) Field of Classification Search ................ 365/145, 365/230.06, 189.09
See application file for complete search history.

(56) References Cited

U.S. PATENT DOCUMENTS

| | | | |
|---|---|---|---|
| 4,873,664 A | 10/1989 | Eaton, Jr. | |
| 5,406,510 A * | 4/1995 | Mihara et al. | ............... 365/145 |
| 5,774,392 A * | 6/1998 | Kraus et al. | ................. 365/145 |
| 5,978,250 A * | 11/1999 | Chung et al. | ................. 365/145 |
| 5,978,251 A | 11/1999 | Kraus et al. | |
| 6,137,711 A | 10/2000 | Tan | |
| 6,151,243 A | 11/2000 | Kim | |
| 6,215,691 B1 * | 4/2001 | Kim et al. | ................... 365/145 |
| 6,233,170 B1 | 5/2001 | Yamada | |
| 6,473,330 B1 | 10/2002 | Ogiwara et al. | |
| 6,560,138 B2 * | 5/2003 | Noro et al. | ................... 365/145 |
| 6,574,134 B1 * | 6/2003 | Chen et al. | ................... 365/145 |
| 6,654,274 B2 * | 11/2003 | Kang et al. | ................. 365/145 |

\* cited by examiner

*Primary Examiner*—Huan Hoang
*Assistant Examiner*—Kretelia Graham
(74) *Attorney, Agent, or Firm*—Marger Johnson & McCollom, P.C.

(57) ABSTRACT

A ferroelectric RAM (Random Access Memory) device includes at least one memory cell constructed of one access transistor operating by a word line enable signal, and one ferroelectric capacitor connected between a bit line and the access transistor. The device has a cell array structure based on a repeated array of the memory cells. The device also includes a word line driver suitable for a high integration and reducing power consumption. The driving method in the ferroelectric RAM device generates a word line enable signal having a level of power source voltage, to read and write data. The method has advantages of being suitable for a high integration, enhancing an operating speed and reducing power consumption and providing stabilized read and write operations.

18 Claims, 10 Drawing Sheets

FERROELECTRIC RAM DEVICE AND DRIVING METHOD

CROSS REFERENCE TO RELATED APPLICATIONS

This application claims priority from Korean Patent Application No. 2003-0094383, filed on Dec. 22, 2003, the contents of which are hereby incorporated by reference for all purposes.

BACKGROUND OF THE INVENTION

1. Field of the Invention

The embodiments of the invention relate to a semiconductor memory device, and more particularly, to a ferroelectric RAM (Random Access Memory) device provided with a cell array or word line driver suitable for high integration, and a method of driving the word line driver and the driving method to read and write data.

2. Description of the Related Art

Recently, ferroelectric thin films have been employed to a dielectric layer of a capacitor to improve a limitation of a refresh necessary for a DRAM (Dynamic Random Access Memory) device for the use a of large capacity of memory. A ferroelectric RAM (FeRAM) using such a ferro electric thin film has an advantage of preserving storage information under a cut-off state of power, as a kind of nonvolatile memory device, and advantages of high access, of reducing power consumption, and of strength against impact. Thus, the ferroelectric RAM is expected to be used as a main memory device in various kinds of electronic instruments and equipment having a file storage and a search function, such as a portable computer, a cellular phone, a game device, etc., or as recording media for recording sound or image.

In the ferroelectric DRAM device, '1' or '0' as data having a logical state is stored at a memory cell that is configured of a ferroelectric capacitor and an access transistor, in conformity with an electrically polarized state of the ferroelectric capacitor. When a voltage is applied to both terminals of the ferroelectric capacitor, ferroelectric material is polarized by a direction of an electric field, and a switching threshold voltage for which the polarization state of the ferroelectric material is changed, is called a coercive voltage. To read data stored in the memory cell, a voltage is applied between both electrodes of the ferroelectric capacitor so as to generate a potential difference, thus a state of data stored in the memory cell is sensed by a change of charge amount excited to a bit line.

FIG. 1 illustrates a general hysteresis curve of ferroelectric material. In the hysteresis curve, an X axis indicates a voltage applied to the ferroelectric material, namely, the voltage applied to both terminals of a capacitor under an assumption that among two electrodes of a ferroelectric capacitor, one electrode connected to a plate line is called a positive electrode and the other electrode is called a negative electrode. A Y axis indicates an amount of charge distributed to a surface thereof, in compliance with a spontaneous polarization of the ferroelectric material, that is, a polarization degree ($\mu C/cm^2$).

Referring to FIG. 1, when a ground voltage Vss or 0V is applied, and thus there is no electric field applied to the ferroelectric material, a polarization is not generated. When voltage of both terminals in the ferroelectric capacitor increases to a positive direction, the polarization degree or charge amount increases from zero to a state point A of a positive polarization region. The polarization at the state point A is generated in one direction, and the polarization degree at the state point A reaches a maximum value. At this time, the polarization degree, due to the amount of charge kept in the ferroelectric material, is represented as Qs. After that, even though the voltage in both terminals of the capacitor again falls to the ground voltage Vss, the polarization degree does not fall to zero, but remains at a state point B. The residual polarization, due to the amount of charge contained in the ferroelectric material, namely, a residual polarization degree, is indicated as +Qr. Next, when the voltage of both terminals of the capacitor increases in a negative direction, the polarization degree is changed from the state point B to a state point C provided within a negative charge polarization region. At the state point C, the ferroelectric material is polarized in a direction opposite to the direction polarized at the state point A, and this polarization degree is represented as −Qs. Then, even though the voltage of both terminals of the capacitor again falls to the ground voltage Vss, the polarization degree does not fall to zero, but remains at a state point D. At this time, the residual polarization degree is indicated as −Qr. When the magnitude of voltage applied to both terminals of the capacitor again increases in a positive direction, the polarization degree of ferroelectric material is changed from the state point D to thestate point A.

As described above, when voltage for generating an electric field is applied one time to the ferroelectric capacitor in which ferroelectric material is inserted into two electrodes, a polarization direction is maintained in conformity with a spontaneous polarization even though the electrodes are determined as a floating state. A surface charge of the ferroelectric material through the spontaneous polarization is not naturally lost by a leakage etc. If the voltage is not applied in an opposite direction so that the polarization degree becomes zero, the polarization direction is maintained intact.

When the voltage is applied to the ferroelectric capacitor in a positive direction and is then removed, the residual polarization of ferroelectric material constituting the ferroelectric capacitor becomes a state of +Qr. When the voltage is applied to the ferroelectric capacitor in a negative direction and is then removed, the residual polarization of ferroelectric material becomes a state of −Qr. Herewith, it is assumed that in the residual polarization a logic state of +Qr state indicates data '0', a logic state of −Qr state indicates data '1'.

FIG. 2 illustrates a memory cell constituting a memory cell array in a ferroelectric RAM device according to a prior art.

Referring to FIG. 2, the memory cell is constructed of one access transistor N1 and one ferroelectric capacitor C1. The access transistor N1 has two terminals, namely, a source terminal and a drain terminal, which are each connected between one electrode of the ferroelectric capacitor C1 and a bit line BL, and a gate thereof is connected to a word line. The other electrode of the ferroelectric capacitor C1's electrode, of which is connected to the access transistor N1, is connected to a plate line PL.

Read and write operations in the ferroelectric RAM device provided with the cell array are performed by an inversion of the above-described polarization, the cell array having a plurality of memory cells arranged in rows and columns. Thus, an operating speed of the ferroelectric RAM is decided by a polarization inversion time, and a polarization inversion speed is decided by an area of the capacitor, thickness of a ferroelectric thin film and an applied voltage etc.

FIGS. 3 and 4 are circuit diagrams of a cell array in a ferroelectric RAM according to the prior art. FIG. 3 is the circuit diagram of the ferroelectric RAM cell array based on an open or shared bit line structure. FIG. 4 is the circuit diagram of the ferroelectric RAM cell array based on a folded bit line structure.

As shown in FIGS. 3 and 4, the structure of the ferroelectric cell array is similar to the structure of a cell array of DRAM (Dynamic Random Access Memory), except in the use of a data storing capacitor in which ferroelectric material is used as a dielectric. That is, the ferroelectric RAM cell array is divided into opened and folded types in compliance with a bit line structure to sense data of a memory cell.

In the opened-type bit line structure of FIG. 3, memory cells 10 are arranged in a matrix, the memory cell 10 having a transistor N2 connected between a bit line BLi and a ferroelectric capacitor C2, wherein a gate of the capacitor N2 is connected to a word line WLi. The memory cells connected to the same bit line are each connected to mutually different plate lines PLi and PLi+1. Conversely, in the folded-type bit line structure of FIG. 4, array units 20 are arranged by a matrix so as to have more prominent degree of integration, and herewith, each one memory cell is connected with two adjacent bit lines BLi and BLi+1, and the memory cells are each connected to word lines WLi and WLi+1. Also, ferroelectric capacitors C3 forming the memory cells are connected commonly to one plate line.

An example for such an opened-type structure is disclosed in U.S. Pat. No. 6,137,711 patent granted to Agilent Technologies Inc. with the inventor of Charles M. C. Tan. One example of the folded-type structure is disclosed in U.S. Pat. No. 6,151,243 patent granted to Hyundai Electronics Inc. with the inventor of Jae Whan Kim.

FIG. 5 illustrates a word line driver circuit employed in the ferroelectric RAM device of the prior art.

As shown in FIG. 5, the word line driver circuit is constructed of four transistors and control signals. A word line decoding signal MWL is transferred to a gate of a transistor N5 through a transistor N4 operating by power source voltage VCC, to thus operate the transistor N5. The transistor N5 transfers an external power source voltage VPP having a level higher than the power source voltage to a word line. A discharge transistor N7 operating by a control signal WL_PDB is connected to the word line WL.

Before the word line driver operates, all control signals shown in FIG. 5 except a control signal WL_PDB have ground voltage Vss. When the operation starts, the word line decoding signal MWL is first applied as the power source VCC. Thus, a node voltage between the transistors N4 and N5 increases to a voltage VCC−Vth obtained by deducting a threshold voltage Vth of the transistor N4 from the power source voltage VCC. After a while, a control signal WL_DRV is applied as a level of the external power source voltage VPP, so that the node voltage is boosted to VCC−Vth+VPP by a capacitance between drain and gate of the transistor N5. Then, the transistor N5 has a sufficient gate voltage VCC−Vth+VPP and supplies sufficient current to the word line through the control signal WL_DRV. Therefore, a word line WL voltage reaches a level of the external power source voltage VPP. The access transistor of the memory cell connected to the word line WL is operated by a word line enable signal having the external power source voltage VPP.

Read and write operations in the ferroelectric RAM device of the prior art are described as follows, with reference to FIGS. 1 and 2.

To describe the read operation, it is assumed that data '1' is stored in the ferroelectric capacitor C1 whose polarization state exists at the state point D. The state of the bit line BL is determined as the ground voltage Vss, and the word line enable signal is applied to the word line WL, to thus turn on the access transistor N1. When the power source voltage VCC is applied to the ferroelectric capacitor C1 through the plate line connected to a positive electrode of the ferroelectric capacitor C1, the polarization of the ferroelectric capacitor C1 is changed from the state point D to the state point A. A charge dQ1 corresponding to a state transition is transferred to the bit line BL through the access transistor N1. The charge transfer is detected through a sense amplification of a sense circuit connected to the bit line BL, such as a sense amplifier etc., and this designates that data value '1' was read in the memory cell. A voltage of the bit line BL increases to the power source voltage VCC by the amplification operation of the sense amplifier, hence a polarization of the ferroelectric capacitor C1 is changed from the state point A to the state point B.

After reading the data '1' from the memory cell, the same data '1' on the bit line BL removes voltage applied to the plate line PL, thus producing a reverse state transition from the state point B to the state point C. Also, data '1' is restored by changing the state point C to the state point D by determining the bit line BL voltage as the ground voltage Vss.

In the meantime, when data '0' is stored in the ferroelectric capacitor C1 whose polarization state exists at the state point B, the word line enable signal is applied to the word line WL to turn on the access transistor N1, and the power source voltage VCC is applied to the plate line connected to the positive electrode of the ferroelectric capacitor C1. Then, the polarization of the ferroelectric capacitor C1 is changed from the state point B to the state point A. A charge dQ0 corresponding to such a state transition is transferred to the bit line BL through the access transistor N1. The charge transfer is detected through a sense amplification of a sense circuit connected to the bit line BL, such as a sense amplifier, etc., and this designates that data value '0' was read from the memory cell.

A voltage of the bit line BL is determined as the ground voltage Vss by the amplification operation of the sense amplifier, and then a polarization of the ferroelectric capacitor C1 is changed from the state point A to the state point B, maintaining a logic state of data '0', by removing the voltage of the plate line PL.

Next, in the write operation, to store data '1' in the ferroelectric capacitor C1, the power source voltage VCC is applied to the ferroelectric capacitor C1 through the bit line BL and is then removed, then the polarization of the ferroelectric capacitor C1 is changed to the state point D through the state point C. The state that the polarization is formed at the state point D indicates a storage state of data '1'. Also, to store data '0' in the ferroelectric capacitor C1, when the power source voltage VCC is applied to the ferroelectric capacitor C1 through the plate line PL and is then removed, the polarization of the ferroelectric capacitor C1 is changed to the state point B through the state point A. The state that the polarization is formed at the state point B indicates a storage state of data '0'.

General structure and operation of the ferroelectric RAM device according to the prior art is disclosed in U.S. Pat. No. 4,873,664 granted to Ramtron Corporation with the inventor of Eaton, Jr, et al., and in U.S. Pat. No. 5,978,251 granted to Ramtron International Corporation with the inventors of William F. Kraus et. al.

In the ferroelectric RAM device of the prior art, it may be desirable to connect more memory cells to one plate line in order to manufacture a ferroelectric RAM device of high integration. However, the ferroelectric capacitor has a large capacitance, thus a large charge pulse is necessary for an operation of the capacitor having a large capacitance. That is, a relatively large RC delay results from this large capacitance. This delay issue limits the number of memory cells connected to one plate line. The delay issue also requires more plate line drivers in the ferroelectric RAM of high integration. In other words, a memory chip size becomes large, power consumption increases and an operating time is prolonged. Furthermore, the word line driver of the prior art operates many transistors and several control signals, which is unsuitable for high integration, and there are shortcomings of high power consumption. In addition, the read and write operations are controlled by the plate line voltage and the bit line voltage, that is, data '1' or '0' can't be utilized in one time interval, thus an operating time is also lengthened.

SUMMARY OF THE INVENTION

Some embodiments of the invention provide a ferroelectric RAM (Random Access Memory) device and a driving method thereof, which is suitable for a high integration. The invention enhances an operating speed and reduces power consumption, together with stabilized read and write operations.

BRIEF DESCRIPTION OF THE DRAWINGS

The above and other features of exemplary embodiments of the invention will become readily apparent from the description that follows, with reference to the attached drawings.

DETAILED DESCRIPTION OF THE INVENTION

Exemplary embodiments of the invention are more fully described in detail with reference to FIGS. 6 to 14. The invention may be embodied in many different forms and should not be construed as being limited to the exemplary embodiments set forth herein. Rather, these exemplary embodiments are provided so that this disclosure is thorough and complete, and to convey the concept of the invention to those skilled in the art.

Figure 6:
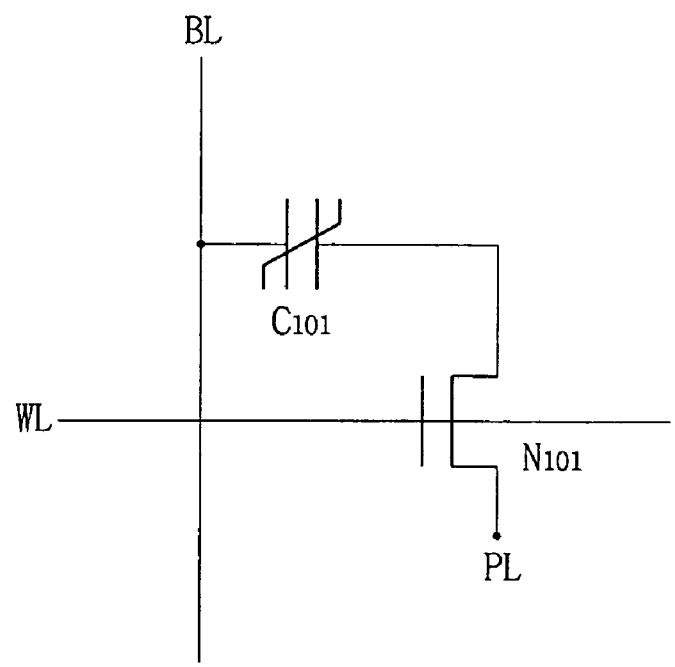
FIG. 6 is a circuit diagram illustrating a structure of a memory cell constituting a memory cell array in a ferroelectric RAM device according to an exemplary embodiment of the invention.

FIG. 6 illustrates a structure of memory cells constituting a memory cell array in a ferroelectric RAM (Random Access Memory) device according to an exemplary embodiment of the invention.

Referring first to FIG. 6, one memory cell is constructed of one access transistor N101 and one ferroelectric capacitor C101. For the ferroelectric capacitor C101, a first electrode is connected to a bit line BL, and a second electrode is connected to a first terminal of the access transistor N101. For the access transistor N101, a first terminal is connected to a second electrode of the ferroelectric capacitor C101 and a second terminal is connected to a plate line PL, and a gate is connected to a word line WL.

The memory cell structure of the invention is configured differently from memory cells constituting a cell array in a typical implementation of a ferroelectric memory. The access transistor N101 operates by a word line enable signal applied through a word line WL. Though it may be also desirable to apply a fixed voltage to the plate line PL, a pulse may be applied thereto. The fixed voltage may be desired to be half of a power source voltage VCC.

The following will be described for a case of the fixed voltage, being applied to the plate line being a half of the power source voltage VCC.

Figure 7:
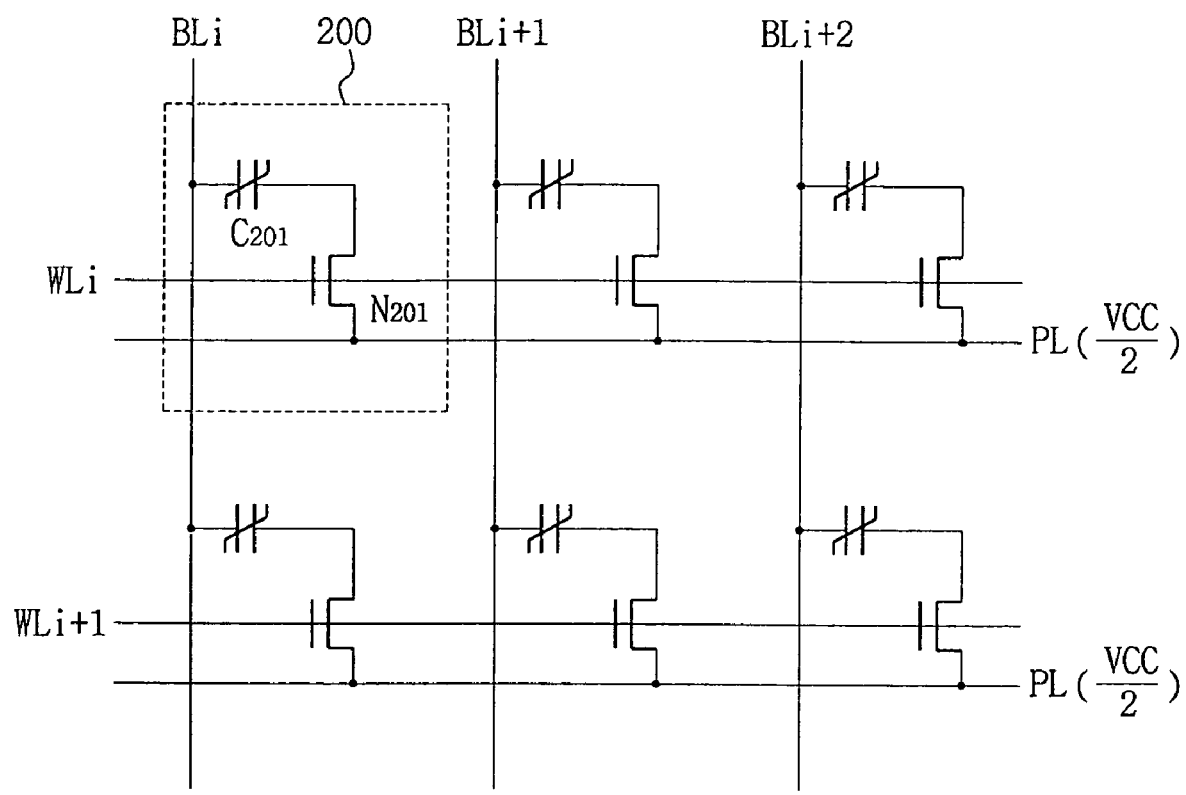
FIG. 7 is a circuit diagram illustrating a structure of memory cell array according to an exemplary embodiment of the invention.

FIG. 7 illustrates an exemplary embodiment of a memory cell array structure in which memory cells based on the structure of FIG. 6 are arranged in rows and columns.

As shown in FIG. 7, a cell array is configured in such a way that a plurality of word lines WLi, and WLi+1, a plurality of bit lines BLi, BLi+1, and BLi+2, and a plurality of memory cells are repeatedly arranged in rows and columns in a matrix structure.

The memory cells 200 constituting the memory cell array each include one access transistor N201 and one ferroelectric capacitor C201, as described in FIG. 6. For the ferroelectric capacitor C201, a first electrode is connected to a bit line BL, and a second electrode is connected to a first terminal of the access transistor N201. For the access transistor N201, a first terminal is connected to a second electrode of the ferroelectric capacitor C201 and a second terminal is connected to a plate line PL, and a gate is connected to a word line WL.

The memory cell array has a matrix structure so that respective memory cells arranged in row and column directions are connected with word lines WLi and WLi+1 arranged in the row direction and with bit lines BLi, BLi+1, and BLi+2 arranged in the column direction. Some memory cells sharing one bit line BL are independently connected with the respective word lines WLi and WLi+1. Memory cells sharing one word line are independently connected with other bit lines. The plate line PL to which a fixed voltage is applied, may be connected, each independently, to every memory block constructed of memory cells. Also, one common plate line may be configured and connected to all memory cells constituting a memory cell array. Furthermore, memory cells sharing one bit line BL or word line WL may share one plate line PL. The fixed voltage applied to the plate line PL may be half of the power source voltage VCC.

Figure 8:
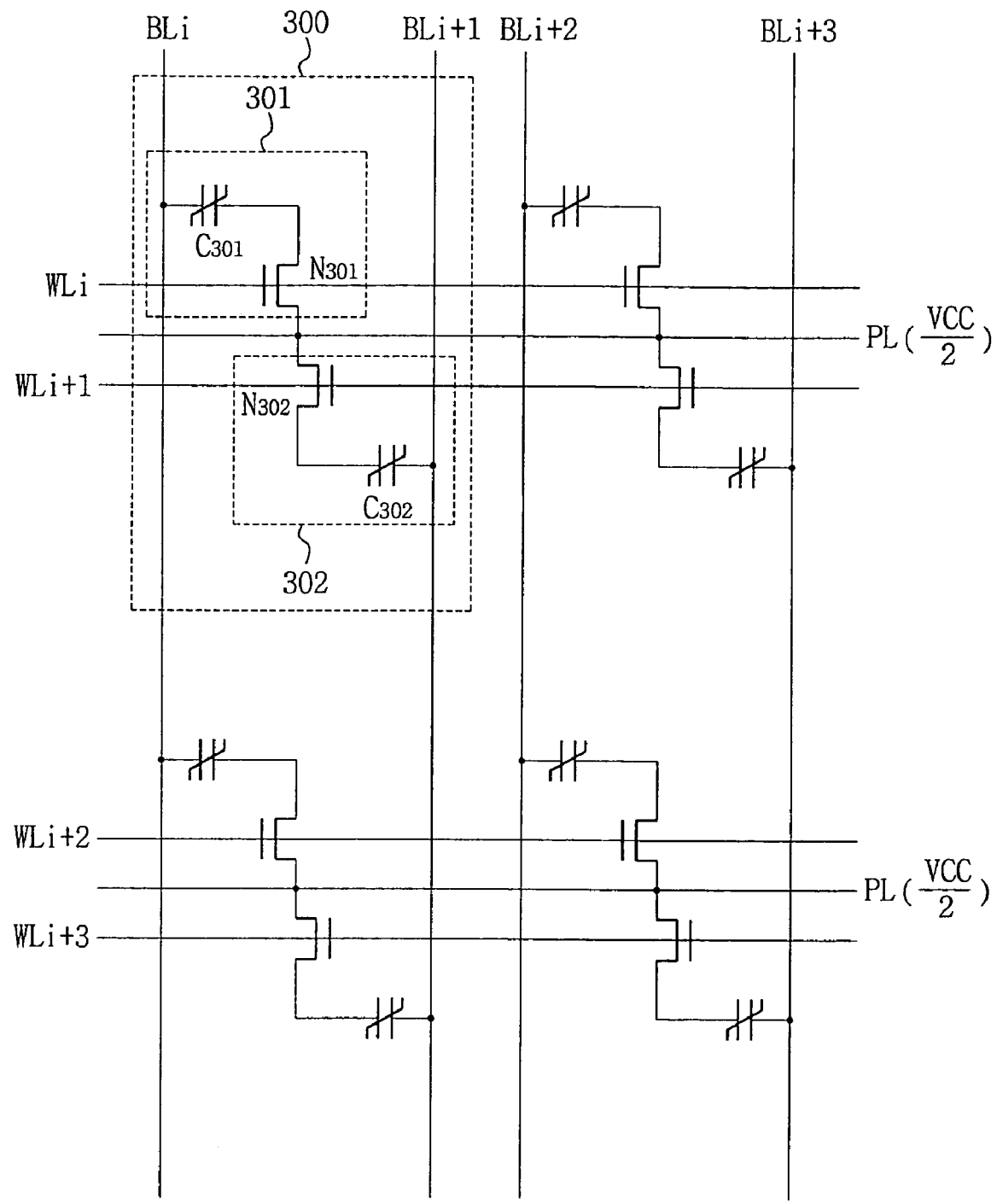
FIG. 8 is a circuit diagram of memory cell array having a folded structure according to an exemplary embodiment of the invention.

FIG. 8 illustrates a memory cell array having a folded structure according to an exemplary embodiment of the invention.

As shown in FIG. 8, a plurality of array units 300 each constructed of a first memory cell 301 and a second memory cell 302 are arranged in rows and columns.

The memory cell array has a matrix structure so that a plurality of respective array units 300 arranged in row and column directions are connected with word lines WLi, WLi+1, WLi+2 and WLi+3 arranged in the row direction, and with bit lines BLi, BLi+1, BLi+2, and BLi+3 arranged in the column direction, through a repeated array.

The first memory cell 301 and the second memory cell 302 constituting the array unit 300 are adjacent to each other. The array unit 300 is constructed of access transistors N301 and N302 operating by a word line enable signal and ferroelectric capacitors C301 and C302 connected between a bit line and an access transistor.

For the first ferroelectric capacitor C301 constituting the first memory cell 301, a first electrode is connected to a first bit line BLi, and a second electrode is connected to a first terminal of the first access transistor N301. For the first access transistor N301, a first terminal is connected to a second electrode of the first ferroelectric capacitor C301, and a gate is connected to a first word line WLi.

For the second ferroelectric capacitor C302 constituting the second memory cell 302, a first electrode is connected to a second bit line BLi+1, and a second electrode is connected to a first terminal of the second access transistor N302. For the second access transistor N302, a first terminal is connected to a second electrode of the second ferroelectric capacitor C302, and a gate is connected to a second word line WLi+1.

The second terminal of the first access transistor N301 constituting the first memory cell 301, and the second terminal of the second access transistor N302 constituting the second memory cell 302, are shared, and are connected to the plate line PL to which a fixed plate voltage VCC/2 is applied.

In a correlation between the plate line PL and the array unit 300, the respective array units share one plate line and are connected thereto, or the plate line may be independently connected to the respective array units, or another connection method may be employed.

Figure 9:
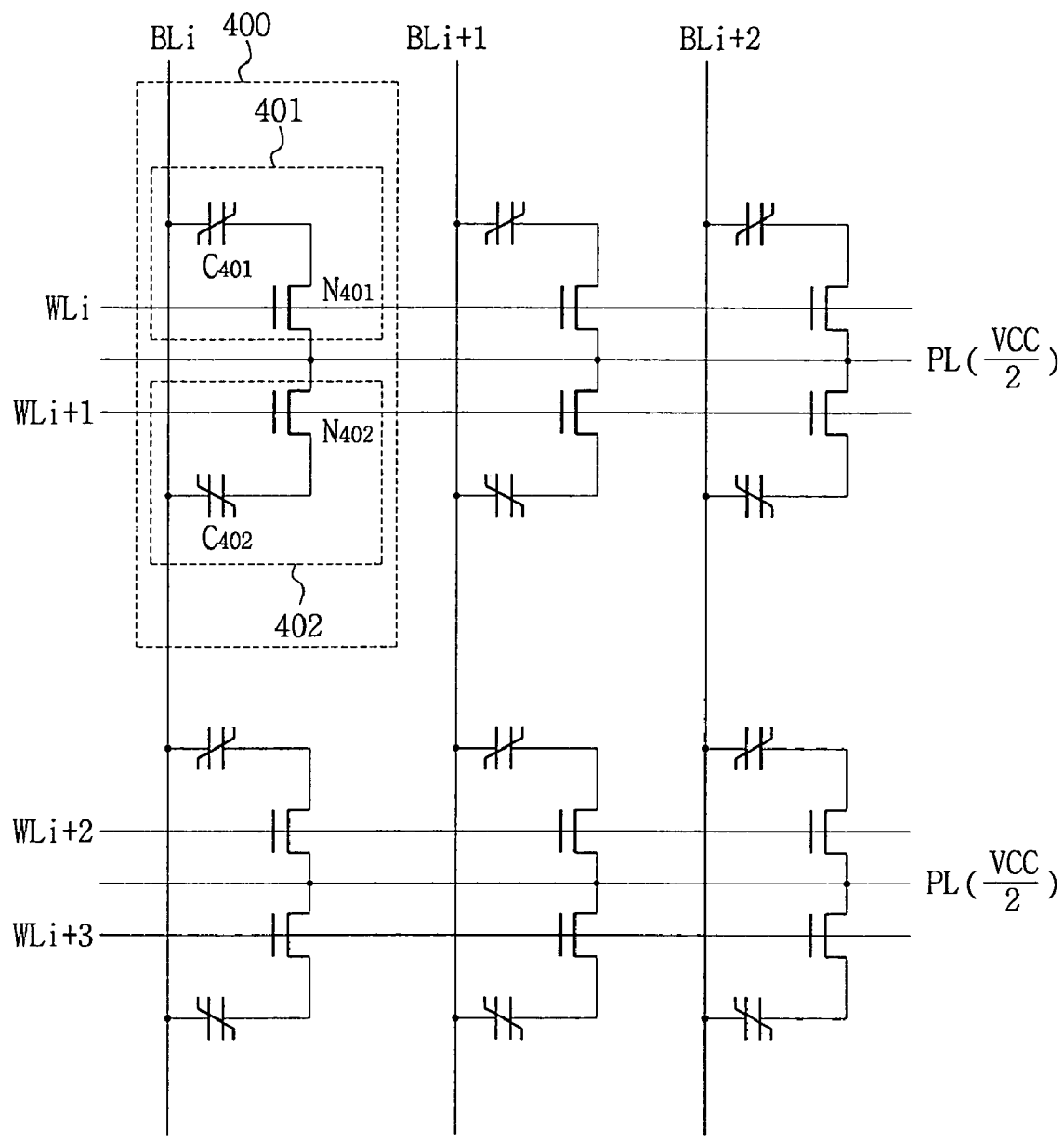
FIG. 9 is a circuit diagram of memory cell array having an open structure so that two cells share a source or drain region according to an exemplary embodiment of the invention.

FIG. 9 illustrates a memory cell array structure of an open type so that two cells share a source or drain region according to an exemplary embodiment of the invention.

As shown in FIG. 9, a plurality of array units 400 each constructed of a first memory cell 401 and a second memory cell 402 are arranged in rows and columns.

The memory cell array has a matrix structure so that the respective array units 400 arranged in row and column directions are connected with word lines WLi, WLi+1, WLi+2 and WLi+3 arranged in the row direction, and with bit lines BLi, BLi+1, and BLi+2 arranged in the column direction, through a repeated array.

The first memory cell 401 and the second memory cell 402 constituting the array unit 400 are adjacent to each other. The array unit 400 is constructed of access transistors N401 and N402 operating by a word line enable signal and ferroelectric capacitors C401 and C402 connected between a bit line and the respective access transistors.

For the first ferroelectric capacitor C401 constituting the first memory cell 401, a first electrode is connected to one bit line BLi, and a second electrode is connected to a first terminal of the first access transistor N401. For the first access transistor N401, a first terminal is connected to a second electrode of the first ferroelectric capacitor C401, and a gate is connected to a first word line WLi.

For the second ferroelectric capacitor C402 constituting the second memory cell 402, a first electrode is connected to the bit line BLi, and a second electrode is connected to a first terminal of the second access transistor N402. For the second access transistor N402, a first terminal is connected to a second electrode of the second ferroelectric capacitor C402, and a gate is connected to a second word line WLi+1.

The second terminal of the first access transistor N401 constituting the first memory cell 401, and the second terminal of the second access transistor N402 constituting the second memory cell 402, are shared, and are connected to the plate line PL to which a fixed plate voltage VCC/2 is applied.

In a correlation between the plate line PL and the array unit 400, the respective array units share one plate line and are connected thereto, or the plate line may be independently connected to the respective array units, or another connection method may be employed.

Figure 10:
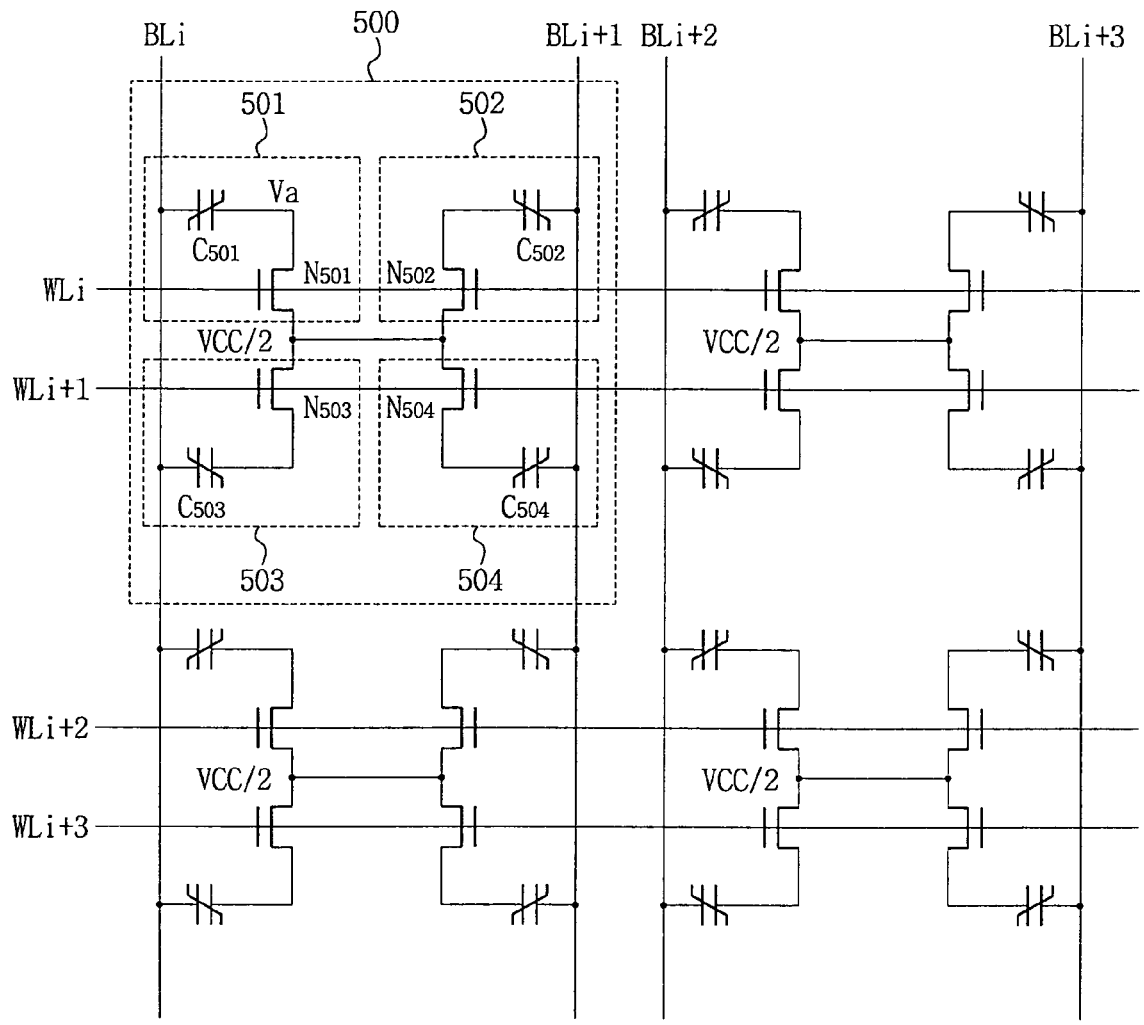
FIG. 10 is a circuit diagram of memory cell array having an open structure so that four memory cells share a source or drain region according to an exemplary embodiment of the invention.

FIG. 10 illustrates a memory cell array structure of an open type so that four memory cells share a source or drain region according to an exemplary embodiment of the invention.

As shown in FIG. 10, a plurality of array units 500 each constructed of a first memory cell 501, a second memory cell 502, a third memory cell 503, and a fourth memory cell 504 are arranged in rows and columns.

The memory cell array has a matrix structure so that the respective array units 500 arranged in row and column directions are connected with word lines WLi, WLi+1, WLi+2, and WLi+3 arranged in the row direction, and with bit lines BLi, BLi+1, BLi+2, and BLi+3 arranged in the column direction, through a repeated array.

The first memory cell 501, the second memory cell 502, the third memory cell 503 and the fourth memory 504, which constitute the array unit 500, are adjacent to each other. The array unit 500 is constructed of access transistors N501 through N504 operating by a word line enable signal and ferroelectric capacitors C501 through C504 connected between bit lines and the respective access transistors.

For the first ferroelectric capacitor C501 constituting the first memory cell 501, a first electrode is connected to a first bit line BLi, and a second electrode is connected to a first terminal of the first access transistor N501. For the first access transistor N501, a first terminal is connected to a second electrode of the first ferroelectric capacitor C501, and a gate is connected to a first word line WLi.

For the second ferroelectric capacitor C502 constituting the second memory cell 502, a first electrode is connected to a second bit line BLi+1, and a second electrode is connected to a first terminal of the second access transistor N502. For the second access transistor N502, a first terminal is connected to a second electrode of the second ferroelectric capacitor C502, and a gate is connected to a first word line WLi.

For the third ferroelectric capacitor C503 constituting the third memory cell 503, a first electrode is connected to a first bit line BLi, and a second electrode is connected to a first terminal of the third access transistor N503. For the third access transistor N503, a first terminal is connected to a second electrode of the third ferroelectric capacitor C503, and a gate is connected to a second word line WLi+1.

For the fourth ferroelectric capacitor C504 constituting the fourth memory cell 504, a first electrode is connected to a second bit line BLi+1, and a second electrode is connected to a first terminal of the fourth access transistor N504. For the fourth access transistor N504, a first terminal is connected to a second electrode of the fourth ferroelectric capacitor C504, and a gate is connected to a second word line WLi+1.

A second terminal of the first access transistor N501 constituting the first memory cell 501, and a second terminal of the third access transistor N503 constituting the third memory cell 503, are shared in common. A second terminal of the second access transistor N502 constituting the second memory cell 502, and a second terminal of the fourth access transistor N504 constituting the fourth memory cell 504, are shared in common. Also, the first access transistor N501 and the third access transistor N503, which constitute the first memory cell 501 and the third memory cell 503, respectively, share a second common terminal to be then connected to the plate line to which the plate voltage VCC/2 is applied.

In a correlation between the plate line and the array unit 500, the respective array units share one plate line and are connected thereto, or the plate line may be independently connected to the respective array units, or another connection method may be employed.

Figure 11:
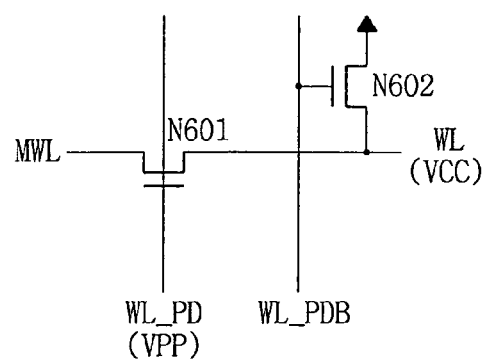
FIG. 11 is a circuit drawing of word line driver in a ferroelectric RAM device to an exemplary embodiment of the invention.

FIG. 11 is a circuit drawing of a word line driver in a ferroelectric RAM device to an exemplary embodiment of the invention.

Figure 2:
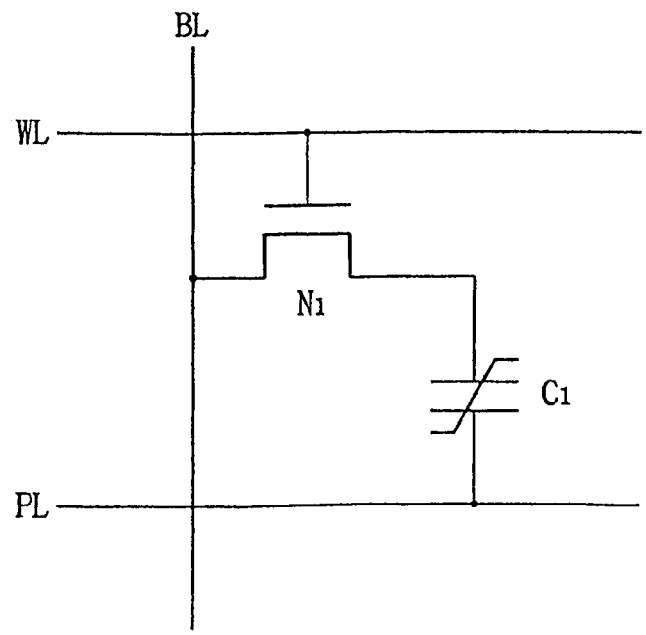
FIG. 2 is a circuit diagram of a memory cell constituting a ferroelectric memory cell array according to a prior art.
Figure 3:
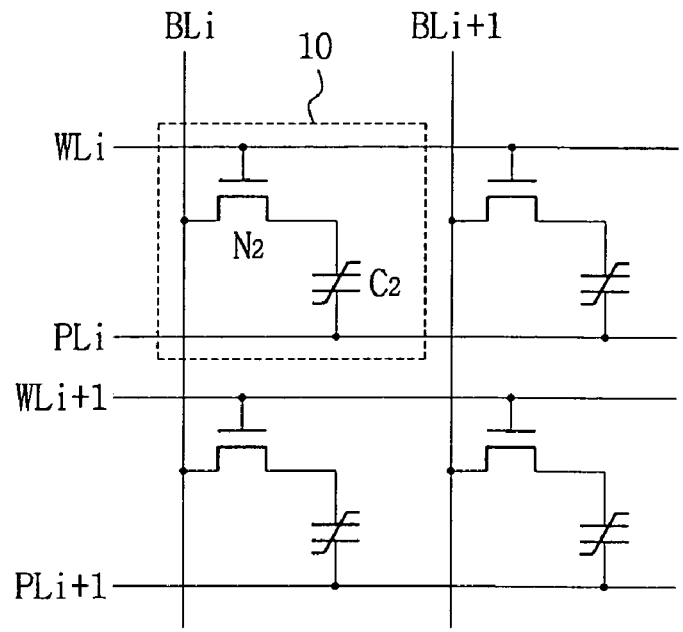
FIG. 3 is a circuit diagram of a ferroelectric memory cell array having an open bit line structure according to a prior art.
Figure 4:
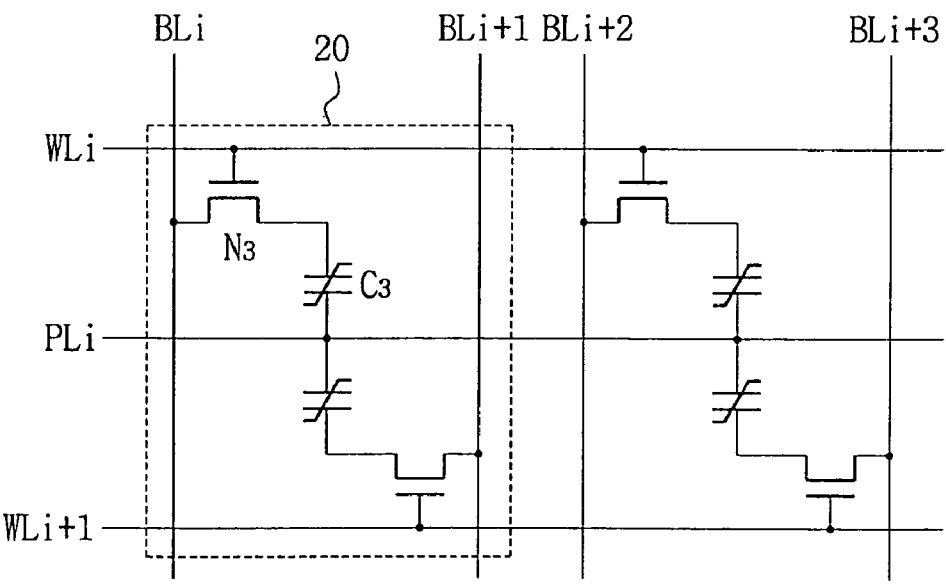
FIG. 4 is a circuit diagram of a ferroelectric memory cell array having a folded bit line structure according to a prior art.
Figure 5:
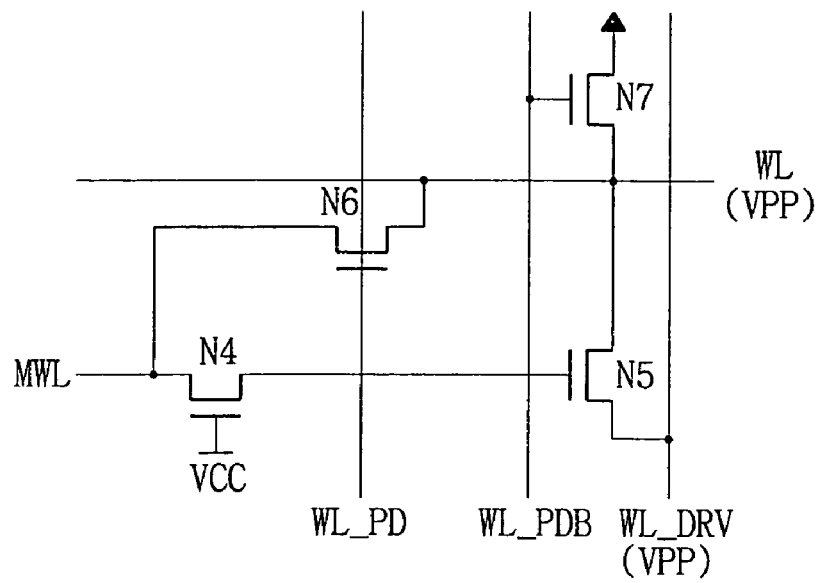
FIG. 5 is a circuit diagram of a word line driver in a ferroelectric RAM device according to a prior art.

With reference to FIG. 11, the word line driver circuit includes a transistor N601 as a switching device and a discharge transistor N602. The transistor N601 is connected between a main word line MWL connected to a word line decoding circuit (not shown) and a word line WL, and operates by a word line enable signal WL_PD. The discharge transistor N602 is connected to the word line WL and operates by a word line disable signal WL_PDB. To the word line WL, a memory cell having the structure like FIG. 6 may be connected, or a memory cell having the structure like FIG. 2 may be connected. The fixed voltage VCC/2 or a pulse signal may be applied to the plate line connected to the memory cell.

To drive the word line driver, an external power source voltage VPP and the power source voltage VCC as an internal power source voltage are used, and the external power source voltage VPP has a level higher than that of the power source voltage. The external power source voltage VPP may desirably have a level higher by 1.5 times than the power source voltage.

A voltage to completely separate the polarization of ferroelectric material of the ferroelectric capacitor is assumed to be lower than that of the power source voltage VCC, with the ferroelectric capacitor constituting the memory cell. This may desirably be a voltage VCC/2 having a level that is ½ times of the power source voltage.

When the word line driver is under a stand-by state, the main word line MWL voltage and the word line enable signal WL_PD are set to a ground voltage Vss, and the word line disable signal WL_PDB is set to the power source voltage VCC, thus the discharge transistor N602 operates to disable the word line WL. To perform read and write operations, in the word line decoding circuit the word line decoding signal having a level of power source voltage VCC is applied to the main word line MWL. Simultaneously, the word line disable signal WL_PDB is set to the ground voltage Vss, to stop a discharge of word line WL. Then, when the word line enable signal WL_PD is applied at a level of the external power source voltage VPP, the switching transistor N601 is turned on, to transfer a voltage of the main word line MWL having a level of power source VCC to the word line WL. The voltage transferred to the word line WL operates an access transistor constituting a memory cell connected to the word line. Next, when the required operations are all performed, all signals are again set at the ground voltage Vss, and only the word line disable signal WL_PDB is set to the power source voltage VCC, to discharge and disable the word line.

For the word line driver, it is not necessary to have a level of the power source voltage VCC be applied to the ferroelectric capacitor through the access transistor constituting the memory cell. Also, it is not necessary to have a level of the external power source voltage VPP on a word line. Thus, the word line driver in the exemplary embodiment of the invention can be simply configured of two transistors contrary to the convention, so as to be advantageous for a high integration and to provide a quick operating speed and a small power consumption.

Figure 12:
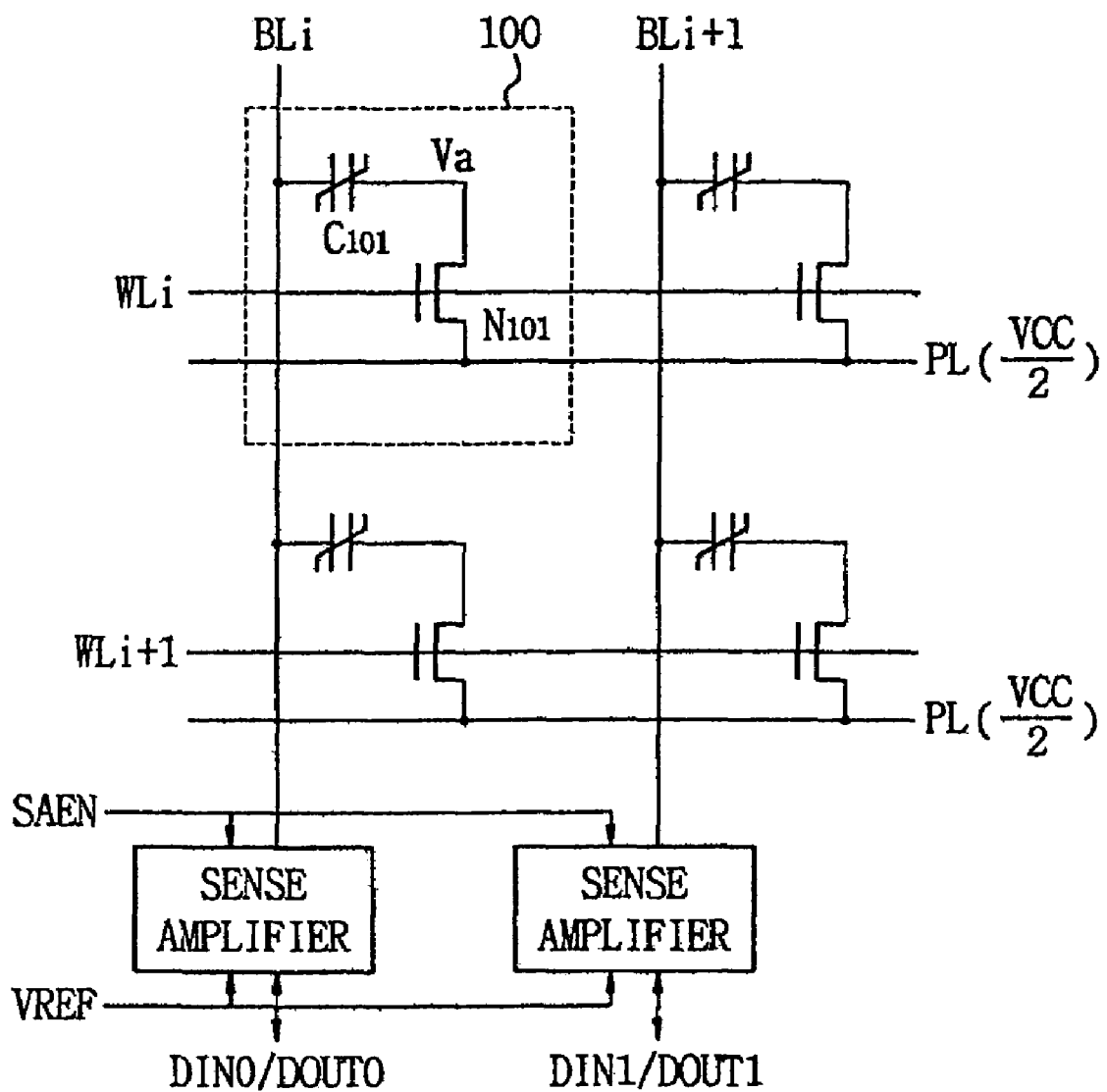
FIG. 12 is a circuit diagram schematically illustrating a ferroelectric RAM device for read and write operations, according to an exemplary embodiment of the invention.
Figure 13:
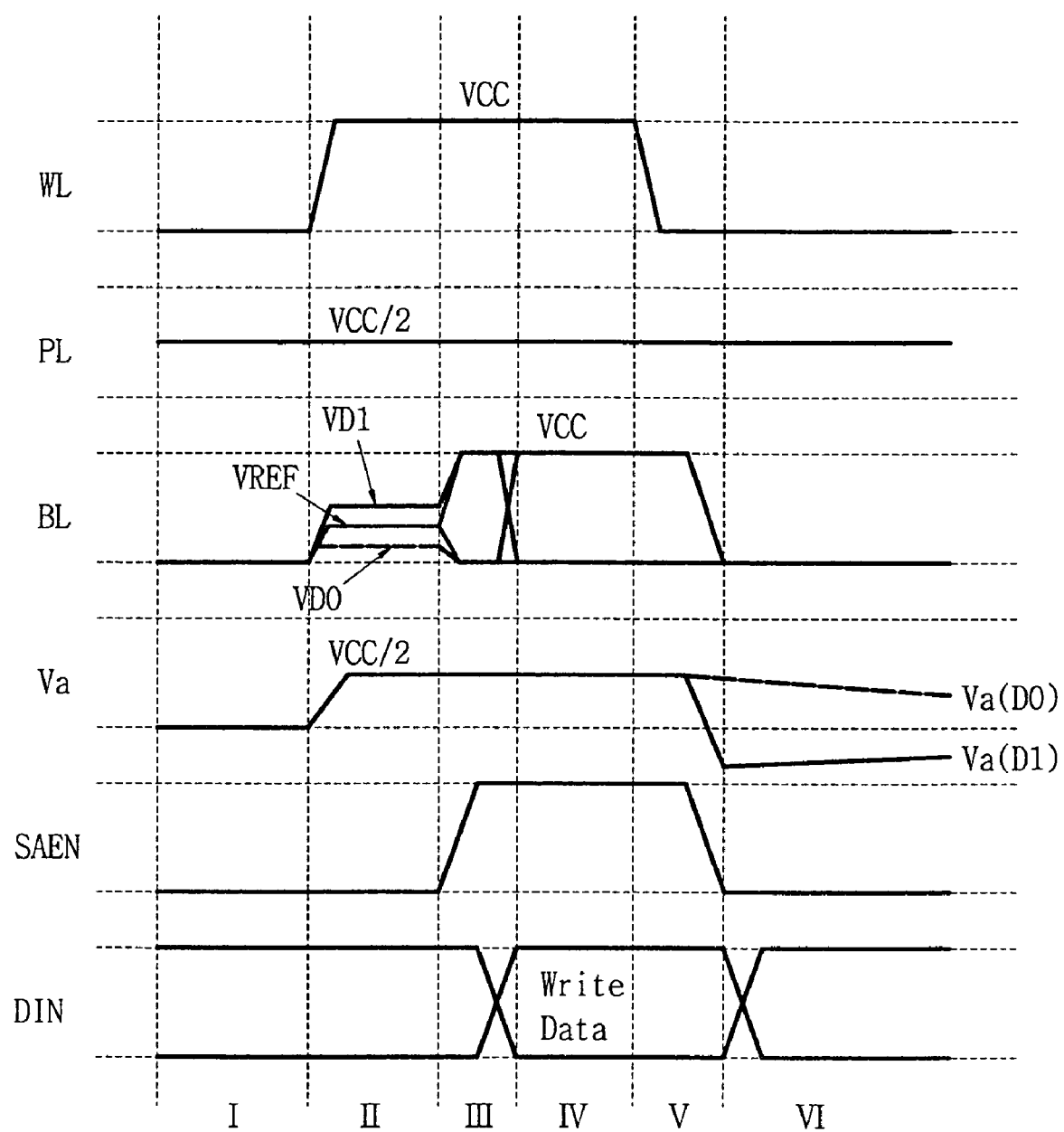
FIG. 13 is a timing diagram illustrating a write operation in the device referred to in FIG. 12.
Figure 14:
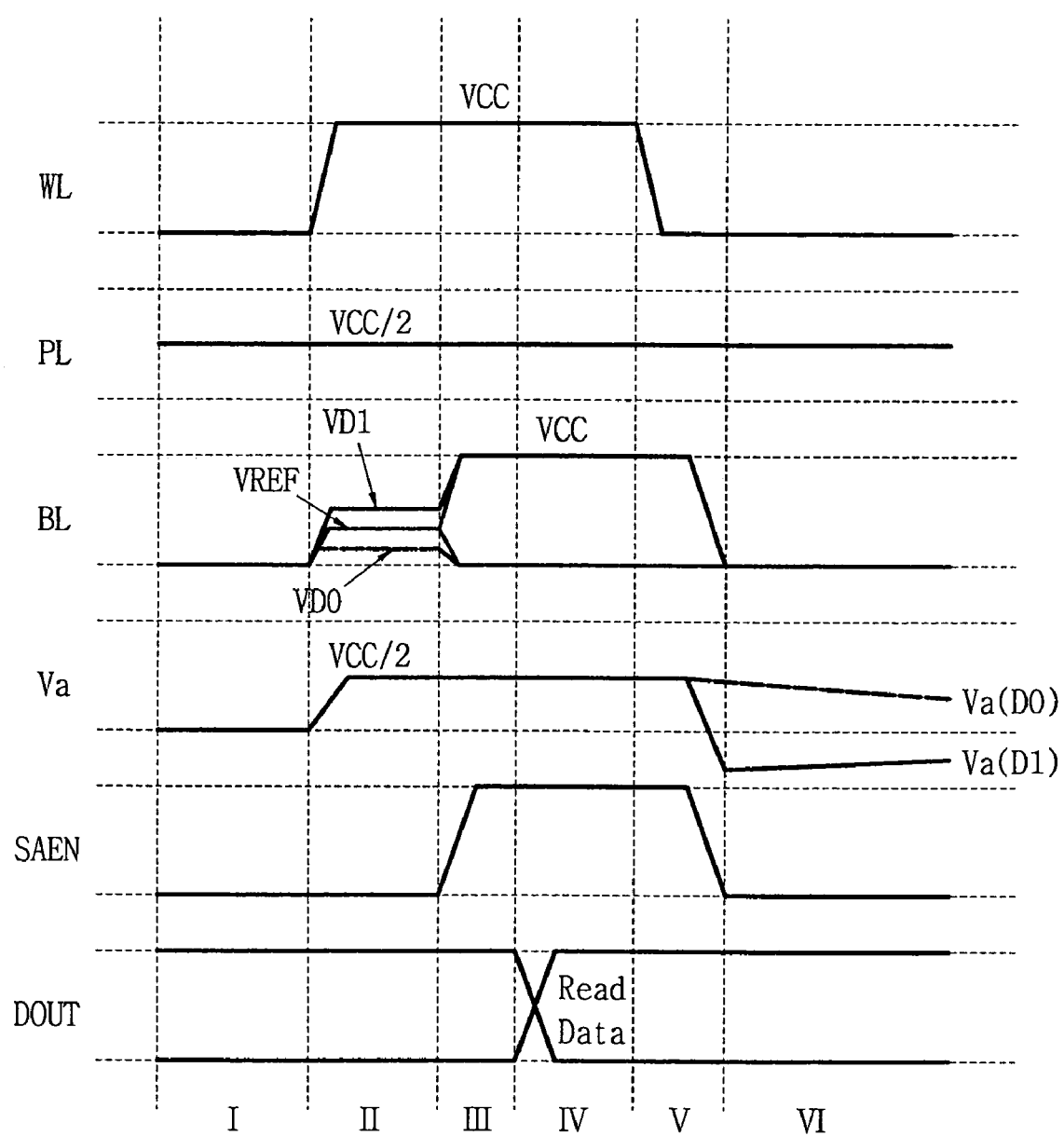
FIG. 14 is a timing diagram illustrating a read operation in the device referred to in FIG. 12.

FIG. 12 is a circuit diagram schematically illustrating a ferroelectric RAM device having a memory cell array connected to a sense amplifier, to describe read and write operations, in an example cell array structure of FIG. 7. FIG. 13 is a timing diagram illustrating a write operation for the circuit referred to in FIG. 12. FIG. 14 is a timing diagram illustrating a read operation for the circuit referred to in FIG. 12. The cell array structure in the ferroelectric RAM device may employ not only the cell array structure shown in FIGS. 7 to 10 but also various types of cell array structures.

As shown in FIG. 12, in the cell array a plurality of word lines WLi and WLi+1 and a plate voltage PL are represented along corresponding rows and a plurality of bit lines BLi and BLi+1 are represented along corresponding columns.

A memory cell 100 constituting the cell array is configured as a serial connection between one access transistor N101 and one ferroelectric capacitor C101. The other conductive region of the access transistor, which is not connected to the ferroelectric capacitor C101, may be connected to a plate line to which the fixed voltage VCC/2 is applied, or to a pulse generator, and a gate is connected to a word line WLi. Also, the other electrode of the ferroelectric capacitor C101, to which the access transistor N101 is not connected, is connected to a bit line BLi.

The sense amplifier is connected to the bit line and operates by a sense amplifier enable signal SAEN, to sense and amplify a voltage level of the bit line. A voltage needed to completely separate the polarization of ferroelectric material of the ferroelectric capacitor is assumed to be lower than the power source voltage VCC. This may desirably be a voltage VCC/2 having a level that is half the power source voltage. In the following it is assumed that a voltage to completely separate the polarization of ferroelectric material is half the power source voltage Vcc.

First, in writing data '1' or '0' in one memory cell 100 among a plurality of memory cells within a memory cell array, the write operation in the memory device will be described referring to the timing diagram shown in FIG. 13.

As shown in FIG. 13, in a writing initial operation a bit line voltage BL is set to the ground voltage Vss or 0V by a bit line precharge circuit(not shown). A plate line voltage PL is set to a fixed voltage, e.g., half the power source voltage VCC, for an interval 'I'.

When a word line voltage WL applied from the word line driver is enabled as the power source voltage VCC, the access transistor N101 constituting the memory cell 100 is turned on by the word line voltage WL, and a node Va increases to the fixed voltage VCC/2 having the same level as the plate voltage PL. Also, data stored in the memory cell 100 is sensed in an interval 'II'. During the interval 'II', the fixed voltage VCC/2 which is the level that is needed to completely separate the polarization of ferroelectric material of the ferroelectric capacitor C101 corresponding to a selected word line WLi, is applied to the ferroelectric capacitor C101. When data '0' is stored in the memory cell 100, a polarization degree of the ferroelectric capacitor C101 is changed from a state point B to a state point A in the hysteresis curve of FIG. 1. A voltage VD0 corresponding to a charge dQ0, the charge dQ0 corresponding to such a state transition, is induced to the bit line BLi from the ferroelectric capacitor C101. The voltage VD0 corresponding to the data '0' has a level approximately equal to the ground voltage Vss. Meanwhile, when data '1' is stored in the memory cell 100, the polarization degree of the ferroelectric capacitor C101 is changed from the state point D to the state point A. Thus, a charge dQ1 corresponding to such a state transition is imparted onto the bit line BLi from the ferroelectric capacitor C101. That is, when data '1' is stored, a voltage BL on the bit line BLi increases by a voltage VD1 based on the charge dQ1 corresponding to the state transition, for example, about 100 mV, more than the ground voltage Vss.

During the interval 'III', the sense amplify operates by the sense amplifier enable signal SAEN, to thus sense amplified level VD0 or VD1 of the bit line BLi. The voltage changed on the bit line BLi by the polarization of ferroelectric material is compared with a reference voltage VREF, e.g., 50 mV, higher than the ground voltage Vss. At this time, if the changed voltage VD0 on the bit line BLi is lower than the reference voltage VREF, the bit line voltage BL is set to the ground voltage Vss to apply to the ferroelectric capacitor C101. Conversely, if the changed voltage VD1 on the bit line BLi is higher than the reference voltage YREF, a voltage, e.g., VCC, which changes the polarization of the ferroelectric capacitor C101, and also is higher than the reference voltage VREF, is applied to the ferroelectric capacitor C101.

Figure 1:
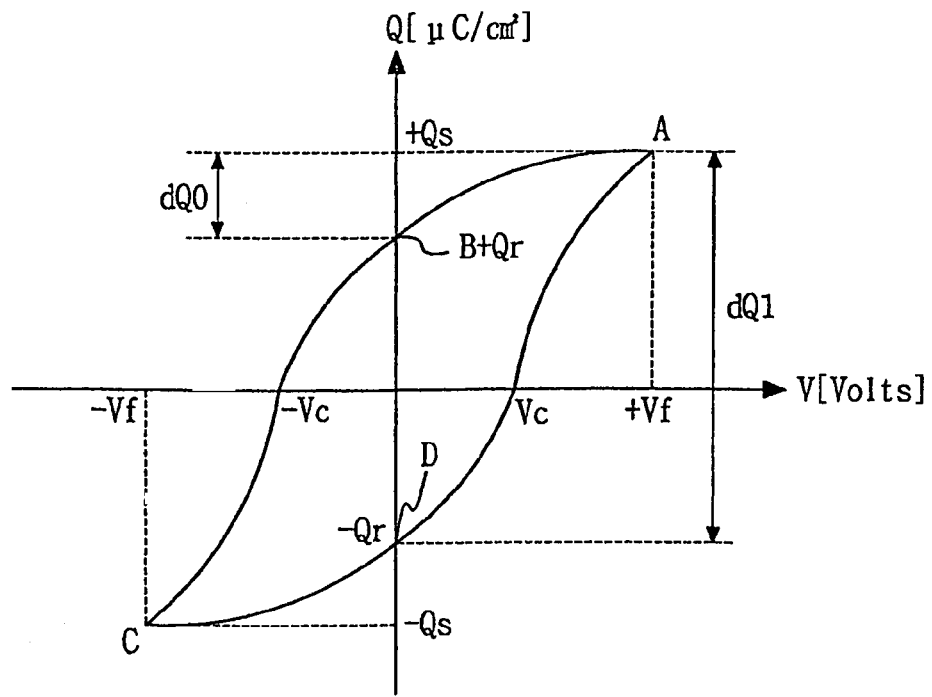
FIG. 1 illustrates a hysteresis curve of ferroelectric material according to a prior art.

Consequently, when the data '0' is stored, in the hysteresis curve of FIG. 1, the polarization degree of the ferroelectric capacitor C101 maintains the state point A, and when the data '1' is stored, the polarization degree of the ferroelectric capacitor C101 is changed from the state point A to the state point C.

In an interval 'IV', an actual write operation is performed. In this interval, a voltage, which corresponds to data DIN0 and DIN1 inputted through a data input/output circuit (not shown) from the outside, is applied, under an assumption that for example, a voltage corresponding to data '0' is Vss and a voltage corresponding to data '1' is VCC. At the same time, the voltage Vss corresponding to the data '0' or the voltage VCC corresponding to the data '1' is transferred to the selected bit line BLi. Herewith, in case the data '0' is written in the memory cell 100, the voltage Vss corresponding to the data '0' is applied to the selected bit line, and in case the data '1' is written, the voltage VCC corresponding to the data '1' is applied to the selected bit line. Thus, in the interval 'IV', when the data '1' is written in the memory cell 100, the polarization degree of the ferroelectric capacitor C101 is positioned at a state point C, and when the data '0' is written, it is positioned at the state point A.

The write operation in the exemplary embodiment of the invention has a voltage level of the bit line BL, differently from the convention, and the polarization degree of the ferroelectric capacitor can be also controlled. In other words, data '1' or '0' can be written in one time interval 'IV', and this enhances an operating speed.

In an interval 'V', the word line WLi is disabled and then the sense amplifier is disabled. Next, the bit line voltage BL is set to the ground voltage Vss. That is, in writing the data '1', the node Va charged as the fixed voltage VCC/2 in the memory cell 100 floats by disabling the word line WLi. Then, when the bit line voltage BL is set to the ground voltage and is changed from the voltage VCC corresponding to the data 'II' to the ground voltage Vss, a coupling is generated by the ferroelectric capacitor, so as to prevent an inverse voltage applied to both terminals of the ferroelectric capacitor C101. This can provide a stabilized operation in writing the data.

The polarization degree of the ferroelectric capacitor C101 in which the data '0' is stored by the voltage VCC/2 of the node Va connected to the ferroelectric capacitor C101 in the afore-described interval 'II', is changed from the state point B to the state point A. The polarization degree of the ferroelectric capacitor C101 in which the data '1' is stored, is changed from the state point D to the state point A. This is generated in all memory cells which share one selected word line. This requires a restore operation so that data of a non-selected ferroelectric capacitor having storage of data '1' is restored to the original state. In these memory cells, the restore operation at the time intervals of 'III' 'IV' and 'V' shown in FIG. 13 is performed.

After the above-described write operation, all signals are set to a stand-by state in the interval 'VI'. After the interval 'VI', the polarization degree of the ferroelectric capacitor for the case of writing the data '1' is positioned at the state point D, and in case the data '0' is written, it is positioned at the sate point B. At this point, the write operation of data is completed.

Next, to read data '1' or '0' stored in one memory cell 100 among a plurality of memory cells within the memory cell array, the read operation of the memory device will be described with reference to the timing drawing of FIG. 14.

As shown in FIG. 14, at an initial read operation, the bit line BLi is set to the ground voltage Vss or 0V in a bit line precharge circuit. Also, a plate voltage is set to a fixed voltage, for example, half the power source voltage VCC, at the interval 'I'.

During the interval 'II', the fixed voltage VCC/2, which is the level that is needed to completely separate the polarization of ferroelectric material of the ferroelectric capacitor C101 corresponding to a selected word line WLi, is applied to the ferroelectric capacitor C101. When data '0' is stored in the memory cell 100, a polarization degree of the ferroelectric capacitor C101 is changed from the state point B to the state point A in the hysteresis curve of FIG. 1. A voltage VD0 corresponding to a charge dQ0, the charge dQ0 corresponding to such a state transition, is induced on to the bit line BLi from the ferroelectric capacitor C101. The voltage VD0 corresponding to the data '0' has a level approximately equal to the ground voltage Vss. Meanwhile, when data '1' is stored in the memory cell 100, the polarization degree of the ferroelectric capacitor C101 is changed from the state point D to the state point A. Thus, a charge dQ1 corresponding to such a state transition is imparted onto the bit line BLi from the ferroelectric capacitor C101. That is, when data '1' is stored, a voltage BL on the bit line BLi increases by a voltage VD1 based on the charge dQ1 corresponding to the state transition, for example, about 100 mV, more than the ground voltage Vss.

During the interval 'III', the sense amplifier operates by the sense amplifier enable signal SAEN, to thus sense amplified level VD0 or VD1 of the bit line BLi. The voltage changed on the bit line BLi by the polarization of ferroelectric material is compared with a reference voltage VREF, e.g., 50 mV, higher than the ground voltage Vss. At this time, if the changed voltage VD0 on the bit line BLi is lower than the reference voltage VREF, the bit line voltage BL is set to the ground voltage Vss, to apply to the ferroelectric capacitor C101. Conversely, if the changed voltage VD1 on the bit line BLi is higher than the reference voltage VREF, a voltage, e.g., VCC, which is higher than the reference voltage VREF, is applied to the ferroelectric capacitor C101, changing the polarization of the ferroelectric capacitor That is, when the data '0' is stored, in the hysteresis curve of FIG. 1 the polarization degree of the ferroelectric capacitor C101 is maintained as the state point A, and when the data '1' is stored, the polarization degree of the ferroelectric capacitor C101 is changed from the state point A to the state point C.

In the interval 'VI', data DOUT0 and DOUT1, which correspond to the voltage VCC for the data '1' or to the voltage for the data '0' amplified in the sense amplifier, respectively is, outputted to the outside through a data input/output circuit.

In the interval 'V', the word line WLi is disabled and then the sense amplifier is disabled, next, the bit line voltage BL is set to as the ground voltage Vss. In reading the data '1', the node Va charged by the fixed voltage VCC/2 in the memory cell 100 floats by the disabled word line WLi. Then, when the bit line voltage BL is determined as the ground voltage, so the bit line voltage BL is changed from the voltage VCC corresponding to the data '1' to the ground voltage Vss, a coupling is generated by the ferroelectric capacitor, to thus prevent an inverse voltage applied to both terminals of the ferroelectric capacitor C101.

In the afore-described 'II' the polarization degree of the ferroelectric capacitor C101 having a storage of the data '0' is changed from the state point B to the state point A by the voltage VCC/2 of the node Va connected to the ferroelectric capacitor C101, and the polarization of the ferroelectric capacitor C101 having a storage of the data '1' is changed from the state point D to the state point A. This is also generated in all memory cells that share one selected word line. This results in requiring a restore operation to restore data of non-selected ferroelectric capacitor having the storage of data '1' to the original state. These memory cells perform the restore operation in time intervals of 'III' 'IV' and 'V' shown in FIG. 14.

After such read operations, all signals are determined as a stand-by state, in an interval 'VI'. After the interval 'VI', the polarization degree of the ferroelectric capacitor is positioned at the state point D when the data '1' was read, and is positioned at the state point B when the data '0' was read. At this point, the data read operation is completed.

Though in the exemplary embodiments of the invention, the data '0' corresponds to the state point B of the hysteresis loop referred to in FIG. 1, and the data '1' corresponds to the state point D, the data '1' may correspond to the state point B and the data '0' may correspond to the state point D, easily by those skilled in the art.

As described above, according to an exemplary embodiment of the invention, a fixed voltage is applied without applying a pulse to a plate line, thereby the number of plate lines connected to a ferroelectric RAM device can be reduced, obtaining a ferroelectric RAM device suitable for a high integration. Furthermore, signals of a pulse type causing a speed lowering are reduced, enhancing an operating speed. Also, a word line driver can be configured simply, being helpful for a high integration and reducing power consumption and enhancing an operating speed.

Read and write operations can be performed stably, and data '1' or '0' can be written at one time line, enhancing the operating speed. An inverse voltage across both electrodes of a ferroelectric capacitor can be prevented by setting a bit line to a ground voltage after disabling a word line, obtaining stabilized read and write operations.

Embodiments of the invention may be practiced in many ways. What follows are exemplary, non-limiting descriptions of some of these embodiments.

An exemplary embodiment of the invention provides a ferroelectric RAM device that includes at least one memory cell, the memory cell being constructed of one access transistor operated by a word line enable signal and one ferroelectric capacitor connected between a bit line and the access transistor.

In the access transistor, a first terminal is connected to a second electrode of the ferroelectric capacitor in which a first electrode is connected to the bit line, and a second terminal is connected to a plate line. A gate may be connected to a word line and a fixed voltage or pulse may be applied to the plate line.

Another exemplary embodiment of the invention provides a ferroelectric RAM device, in a ferroelectric semiconductor memory device having a memory cell array in which a plurality of array units are repeatedly arranged in rows and columns in a matrix structure, the array unit being constructed of memory cells. Herewith, the array unit includes a first memory cell that is constructed of a first access transistor operated by a first word line enable signal and a first ferroelectric capacitor connected between a first bit line and the first access transistor; and a second memory cell that is constructed of a second access transistor operated by a second word line enable signal and a second ferroelectric capacitor connected between a second bit line and the second access transistor, and that is adjacent to the first memory cell.

The first memory cell and the second memory cell may be connected to one plate line. A first terminal of the first access transistor is connected to a second electrode of the first ferroelectric capacitor in which a first electrode is connected to the first bit line. A first terminal of the second access transistor is connected to a second electrode of the second ferroelectric capacitor in which a first electrode is connected to the second bit line. A second terminal of the first access transistor and a second terminal of the second access transistor are shared in common each other and may be connected to the plate line.

Another exemplary embodiment of the invention provides a ferroelectric RAM device, in a ferroelectric semiconductor memory device having a memory cell array in which a plurality of array units are repeatedly arranged in rows and columns in a matrix structure, the array unit being constructed of memory cells. Herewith, the array unit includes a first memory cell that is constructed of a first access transistor operating by a first word line enable signal and a first ferroelectric capacitor connected between one bit line and the first access transistor; and a second memory cell that is constructed of a second access transistor operated by a second word line enable signal and a second ferroelectric capacitor connected between the one bit line and the second access transistor, and that is adjacent to the first memory cell, the one bit line being connected to the first memory cell.

The first memory cell and the second memory cell may be connected to one plate line. A first terminal of the first access transistor is connected to a second electrode of the first ferroelectric capacitor in which a first electrode is connected to the one bit line. A first terminal of the second access transistor is connected to a second electrode of the second ferroelectric capacitor in which a first electrode is connected to the one bit line. A second terminal of the first access transistor and a second terminal of the second access transistor are shared in common and may be connected to the plate line.

Another exemplary embodiment of the invention provides a ferroelectric RAM device, in a ferroelectric semiconductor memory device having a memory cell array in which a plurality of array units are repeatedly arranged in rows and columns in a matrix structure, the array unit being constructed of memory cells. Herewith, the array unit includes a first memory cell, a second memory cell, a third memory cell and a fourth memory cell.

Herewith, the first memory cell is constructed of a first access transistor operated by a first word line enable signal and a first ferroelectric capacitor connected between a first bit line and the first access transistor.

The second memory cell is constructed of a second access transistor operating by the first word line enable signal and a second ferroelectric capacitor connected between a second bit line and the second access transistor. The second memory cell is adjacent to the first memory cell.

The third memory cell is constructed of a third access transistor operating by a second word line enable signal and a third ferroelectric capacitor connected between the first bit line and the third access transistor. The third memory cell is adjacent to the first memory cell and the second memory cell.

The fourth memory cell is constructed of a fourth access transistor operating by the second word line enable signal and a fourth ferroelectric capacitor connected between the second bit line and the fourth access transistor. The fourth memory cell is adjacent to the first to third memory cells.

The first through fourth memory cells may be connected to one plate line.

Another exemplary embodiment of the invention provides a ferroelectric RAM device, including at least one memory cell that is constructed of an access transistor in which a gate is connected to a word line and a ferroelectric capacitor connected between the access transistor and a bit line; and a word line driver for operating the access transistor of the memory cell by transferring a main word line voltage to the word line, through a switching device that responses to an applied word line enable signal.

To the word line, a discharge device for discharging and disabling the word line in response to an applied word line disable signal is further connected.

Another exemplary embodiment of the invention provides a driving method to write data in the ferroelectric RAM device having a memory cell array based on a matrix structure of a plurality of memory cells, the driving method including applying a fixed voltage applied to a first terminal of an access transistor selected by a word line enable signal, to a ferroelectric capacitor, to thus apply a voltage corresponding to data stored in the ferroelectric capacitor to a bit line, the ferroelectric capacitor being connected between the bit line and a second terminal of the access transistor; sense amplifying the voltage applied to the bit line in a sense amplifier; applying a voltage corresponding to write data to the bit line, to store the data in the ferroelectric capacitor; and disabling the word line and setting the bit line as a ground voltage.

The fixed voltage may be half the supply voltage applied to a plate line.

Another exemplary embodiment of the invention provides a driving method to read storage data in a ferroelectric RAM device having a memory cell array based on a matrix structure of a plurality of memory cells, the driving method including applying a fixed voltage applied to a first terminal of an access transistor selected by a word line enable signal, to a ferroelectric capacitor, to thus apply a voltage corresponding to data stored in the ferroelectric capacitor to a bit line, the ferroelectric capacitor being connected between the bit line and a second terminal of the access transistor; sense amplifying the voltage applied to the bit line in a sense amplifier, and outputting it; and disabling the word line and setting the bit line to a ground voltage.

The fixed voltage may be half the supply voltage, applied to a plate line. The above-described device and method enhance an operating speed to obtain a high integration of the ferroelectric RAM memory, reduce power consumption and provide stabilized read and write operations.

It will be apparent to those skilled in the art that modifications and variations can be made in the invention without deviating from the spirit or scope of the invention. Thus, it is intended that the invention cover any such modifications and variations of this invention provided they come within the scope of the appended claims and their equivalents. For instance, in a formation procedure of transistor a shape of substrate, shape of gate electrode, shape of fin or a configuration of layer material may be changed, or manufacturing processes may be added or reduced.

I claim:

1. A ferroelectric random access memory device, comprising:
   a first memory cell, comprising:
      a single ferroelectric capacitor; and
      a first access transistor connected between the ferroelectric capacitor and an independent plate line and operated by a word line enable signal on a word line, the ferroelectric capacitor connected between a bit line and the first access transistor;
   a second memory cell immediately adjacent to the first memory cell, having a second access transistor, the second access transistor connected to the independent plate line; and
   a word line driver coupled to the word line and a word line decoder, the word line driver including:
      a transistor coupled between the word line and the word line decoder, the transistor responsive to a word line enable signal;
      the transistor configured to transfer a main word line signal having a level less than or equal to a level of a first power supply from the word line decoder to the word line in response to the word line enable signal having a level substantially equal to a level of a second power supply, the level of the first power supply being less than the level of the second power supply; wherein the word line driver is configured to maintain the main word line signal having the level less than or equal to the level of the first power supply on the word line without boosting a signal on the word line.

2. The device as claimed in 1, wherein the first access transistor is provided with a first terminal, a second terminal and a gate, the first terminal being connected to a second electrode of the ferroelectric capacitor in which a first electrode is connected to the bit line, the second terminal being connected to the independent plate line, and the gate being connected to the word line.

3. The device as claimed in 2, wherein the independent plate line has an applied fixed voltage of substantially half of a power source voltage.

4. A ferroelectric RAM device, having a memory cell array of a matrix structure in which a plurality of array units are repeatedly arranged in rows and columns, the array unit being constructed of memory cells, the device characterized in that the array unit comprises:
   a first memory cell that is constructed of a first access transistor operated by a first word line enable signal on a first word line and a first ferroelectric capacitor connected between a first bit line and the first access transistor;
   a second memory cell that is constructed of a second access transistor operated by a second word line enable signal on a second word line and a second ferroelectric capacitor connected between a second bit line and the second access transistor, and that is adjacent to the first memory cell, wherein the first memory cell and the second memory cell are connected to one plate line; and
   a plurality of word line drivers, each word line driver coupled to at least one of the first and second word lines and including:

a transistor coupled between the corresponding word line and a word line decoder, the transistor responsive to a corresponding word line enable signal;

the transistor configured to transfer a main word line signal having a level less than or equal to a level of a first power supply from the corresponding word line decoder to the corresponding word line in response to the corresponding word line enable signal having a level substantially equal to a level of a second power supply, the level of the first power supply being less than the level of the second power supply; wherein each word line driver is configured to maintain the main word line signal having the level less than or equal to the level of the first power supply on the word line without boosting a signal on the word line.

5. The device as claimed in 4, wherein a first terminal of the first access transistor is connected to a second electrode of the first ferroelectric capacitor in which a first electrode is connected to the first bit line; a first terminal of the second access transistor is connected to a second electrode of the second ferroelectric capacitor in which a first electrode is connected to the second bit line; and a second terminal of the first access transistor and a second terminal of the second access transistor are shared in common each other and are connected to the plate line.

6. The device as claimed in 5, wherein the plate line has an applied fixed voltage of substantially half of a power source voltage.

7. A ferroelectric RAM device, having a memory cell array of a matrix structure in which a plurality of array units are repeatedly arranged in rows and columns, the array unit being constructed of memory cells, the device characterized in that, the array unit comprises:

a first memory cell that is constructed of a first access transistor operated by a first word line enable signal on a word line and a first and only ferroelectric capacitor, the capacitor being connected between one bit line and the first access transistor; and a second memory cell that is constructed of a second access transistor operated by a second word line enable signal and a second and only ferroelectric capacitor, the capacitor being connected between the one bit line and the second access transistor, the second memory cell being adjacent to the first memory cell, the one bit line being connected to the first memory cell, wherein the first memory cell and the second memory cell are respectively connected to an independent plate line; and the device includes a word line driver coupled to the word line and a word line decoder, the word line driver including:

a transistor coupled between the word line and the word line decoder, the transistor responsive to a word line enable signal;

the transistor configured to transfer a main word line signal having a level less than or equal to a level of a first power supply from the word line decoder to the word line in response to the word line enable signal having a level substantially equal to a level of a second power supply, the level of the first power supply being less than the level of the second power supply; wherein the word line driver is configured to maintain the main word line signal having the level less than or equal to the level of the first power supply on the word line without boosting a signal on the word line.

8. The device as claimed in 7, wherein the plate line has an applied fixed voltage of substantially half of a power source voltage.

9. A ferroelectric RAM device, having a memory cell array of a matrix structure in which a plurality of array units are repeatedly arranged in rows and columns, the array unit being constructed of memory cells, the device characterized in that, the array unit comprises:

a first memory cell that is constructed of a first access transistor operated by a first word line signal and a first ferroelectric capacitor connected between a first bit line and the first access transistor;

a second memory cell that is constructed of a second access transistor operated by the first word line signal and a second ferroelectric capacitor connected between a second bit line and the second access transistor, the second memory cell being adjacent to the first memory cell;

a third memory cell that is constructed of a third access transistor operated by a second word line signal and a third ferroelectric capacitor connected between the first bit line and the third access transistor, the third memory cell being adjacent to the first memory cell and the second memory cell; and a fourth memory cell that is constructed of a fourth access transistor operated by the second word line signal and a fourth ferroelectric capacitor connected between the second bit line and the fourth access transistor, the fourth memory cell being adjacent to the first to third memory cells;

wherein:

a terminal of the first access transistor is shared with a terminal of the third access transistor;

a terminal of the second access transistor is shared with a terminal of the fourth access transistor;

the terminals of the first, second, third, and fourth access transistors are directly connected to each other at a node; and a plate line is connected to the array unit at the node; and the device further comprises:

a word line driver coupled to a word line decoder and the first memory cell, the word line driver including:

a transistor coupled between the first memory cell and the word line decoder, the transistor responsive to a word line enable signal;

the transistor configured to transfer a main word line signal having a level less than or equal to a level of a first power supply from the word line decoder to the first memory cell as the first word line signal in response to the word line enable signal having a level substantially equal to a level of a second power supply, the level of the first power supply being less than the level of the second power supply;

wherein the word line driver is configured to maintain the main word line signal having the level less than or equal to the level of the first power supply as the first word line signal without boosting the first word line enable signal.

10. The device as claimed in 9, wherein the plate line has an applied fixed voltage of substantially half of a power source voltage.

11. A driving method to write data, in a ferroelectric RAM device having a memory cell array based on a matrix structure of a plurality of memory cells, the method comprising:

applying a fixed voltage that is applied through an independent plate line to a first terminal of an access transistor selected by a word line signal, to a ferroelectric capacitor, to thus apply a voltage corresponding to data stored in the ferroelectric capacitor to a bit line, the ferroelectric capacitor being connected between the bit line and a second terminal of the access transistor, applying the fixed voltage including:
applying a first voltage to a main word line;
applying a second voltage to a word line driver transistor to transfer the first voltage as the word line signal to the access transistor; and
maintaining the word line signal having a level less than or equal to the first voltage on the word line without boosting the word line signal;
sense amplifying the voltage applied to the bit line in a sense amplifier;
applying a voltage corresponding to write data to the bit line, to store the data in the ferroelectric capacitor; and
disabling the word line signal prior to setting the bit line to a ground voltage and prior to disabling the sense amplifier;
wherein:
the second voltage is greater than the first voltage; and
the first voltage is transferred as the word line signal until the word line signal is disabled.

12. The method as claimed in 11, wherein the fixed voltage applied though the independent plate line has a level of substantially half of the power source voltage.

13. A driving method to read storage data, in a ferroelectric RAM device having a memory cell array based on a matrix structure of a plurality of memory cells, the driving method comprising:
applying a fixed voltage that is applied through an independent plate line to a first terminal of an access transistor selected by a word line signal, to a ferroelectric capacitor, to thus apply a voltage corresponding to data stored in the ferroelectric capacitor to a bit line, the ferroelectric capacitor being connected between the bit line and a second terminal of the access transistor, applying the fixed voltage including:
applying a first voltage to a main word line;
applying a second voltage to a word line driver transistor to transfer the first voltage as the word line signal to the access transistor; and
maintaining the word line signal having a level less than or equal to the first voltage on the word line without boosting the word line signal;
sense amplifying the voltage applied to the bit line in a sense amplifier, and outputting it; and
disabling the word line signal prior to setting the bit line to a ground voltage and prior to disabling the sense amplifier;
wherein:
the second voltage is greater than the first voltage; and
the first voltage is transferred as the world line signal until the word line signal is disabled.

14. The method as claimed in 13, wherein the fixed voltage applied through the independent plate line has a level of substantially half of the power source voltage.

15. A ferroelectric random access memory device, comprising:
at least one memory cell that includes:
a single ferroelectric capacitor; and
one access transistor connected between the ferroelectric capacitor and an independent plate line and operated by a word line enable signal, the ferroelectric capacitor connected between a bit line and the access transistor; and
a word line driver coupled to the word line and a word line decoder, the word line driver including:
a transistor coupled between the word line and the word line decoder, the transistor responsive to a word line enable signal;
the transistor configured to transfer a main word line signal having a level less than or equal to a level of a first power supply from the word line decoder to the word line in response to the word line enable signal having a level substantially equal to a level of a second power supply, the level of the first power supply being less than the level of the second power supply;
wherein the word line driver is configured to maintain the main word line signal having the level less than or equal to the level of the first power supply on the word line without boosting a signal on the word line.

16. The ferroelectric random access memory device of claim 1 wherein the second access transistor is connected between a second ferroelectric capacitor and the independent plate line and operated by the word line enable signal on the word line, the second ferroelectric capacitor connected between a second bit line and the second access transistor.

17. The ferroelectric random access memory device of claim 1, further comprising:
a third access transistor connected between a third ferroelectric capacitor and a second independent plate line and operated by a second word line enable signal on a second word line, the third ferroelectric capacitor connected between the bit line and the third access transistor.

18. The ferroelectric random access memory device of claim 1, wherein the word line driver is configured to maintain the main word line signal having the level less than or equal to the level of the first power supply on the word line until the word line enable signal is disabled.

* * * * *

UNITED STATES PATENT AND TRADEMARK OFFICE
CERTIFICATE OF CORRECTION

PATENT NO.       : 7,426,130 B2                                         Page 1 of 1
APPLICATION NO.  : 11/015428
DATED            : September 16, 2008
INVENTOR(S)      : Byung-Gil Jeon It is certified that error appears in the above-identified patent and that said Letters Patent is hereby corrected as shown below:

Column 1, line 26, the words "ferro electric" should read -- ferroelectric --;
Column 2, line 23, the word "thestate" should read -- the state --;
Column 11, line 22, the word "YREF" should read -- VREF --;
Column 11, line 62, "'II'" should read -- '1' --;
Column 12, line 62, after the word "capactitor", insert -- C101. --;
Column 12, line 62, start new paragraph beginning with "That is, ...", and ending at Column 12, line 67 with "... point C."

Signed and Sealed this

Twentieth Day of January, 2009

JON W. DUDAS
*Director of the United States Patent and Trademark Office*